(12) United States Patent
Toyota

(10) Patent No.: US 11,985,903 B2
(45) Date of Patent: May 14, 2024

(54) WIRING ELECTRODE

(71) Applicant: Murata Manufacturing Co., Ltd., Nagaokakyo (JP)

(72) Inventor: Yuji Toyota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 334 days.

(21) Appl. No.: 17/528,227

(22) Filed: Nov. 17, 2021

(65) Prior Publication Data

US 2022/0077377 A1   Mar. 10, 2022

Related U.S. Application Data

(63) Continuation of application No. PCT/JP2020/021307, filed on May 29, 2020.

(30) Foreign Application Priority Data

May 30, 2019   (JP) .................................. 2019-100853

(51) Int. Cl.
*H10N 30/87*   (2023.01)

(52) U.S. Cl.
CPC ................................ *H10N 30/877* (2023.02)

(58) Field of Classification Search
CPC .. H03H 9/14541; H03H 9/25; H03H 9/14538; H03H 9/02929; H03H 9/02992; H03H 9/02559; H03H 9/02984; H03H 9/145; H03H 9/1092; H03H 9/6483; H03H 9/02834; H03H 9/64; H10N 30/877;
(Continued)

(56) References Cited

U.S. PATENT DOCUMENTS

| | | | | |
|---|---|---|---|---|
| 2004/0070313 A1* | 4/2004 | Furukawa | .......... | H03H 9/14541 310/313 R |
| 2005/0051872 A1* | 3/2005 | Kawamura | ...... | G06K 19/07779 257/E23.064 |

(Continued)

FOREIGN PATENT DOCUMENTS

| | | |
|---|---|---|
| JP | 03-18031 A | 1/1991 |
| JP | 07-307549 A | 11/1995 |

(Continued)

OTHER PUBLICATIONS

Office Action in JP2021-522895, mailed Oct. 4, 2022, 5 pages.
(Continued)

*Primary Examiner* — Lincoln D Donovan
*Assistant Examiner* — Tyler J Pereny
(74) *Attorney, Agent, or Firm* — Keating & Bennett, LLP

(57) ABSTRACT

A wiring electrode on a piezoelectric substrate includes layers including an adhesive layer in contact with the piezoelectric substrate, an outermost layer indirectly above the adhesive layer, a low-resistance layer between the adhesive layer and the outermost layer, including first and second principal surfaces, and having a lowest electric resistance among the layers, and a barrier layer between the low-resistance layer and the outermost layer. An outer peripheral edge of the second principal surface of the low-resistance layer is inside an outer peripheral edge of the barrier layer, and an outer peripheral edge of the adhesive layer is outside an outer peripheral edge of the low-resistance layer, in plan view.

20 Claims, 11 Drawing Sheets

(58) Field of Classification Search
CPC .. H10N 30/06; H10N 30/8542; H10N 30/872; H10N 30/063; H01L 23/49844; H01L 23/49866; H01L 2924/0002; H01L 2224/11; H05K 1/0265; H05K 1/0306; H05K 1/09; H05K 2201/0338; H05K 3/048; H05K 3/388
See application file for complete search history.

(56) References Cited

U.S. PATENT DOCUMENTS

| | | |
|---|---|---|
| 2013/0075914 A1 | 3/2013 | Ichihara et al. |
| 2014/0061920 A1 | 3/2014 | Hirano et al. |
| 2017/0338796 A1 | 11/2017 | Morimoto et al. |
| 2019/0098770 A1* | 3/2019 | Nasu .................... H05K 3/4626 |

FOREIGN PATENT DOCUMENTS

| | | | |
|---|---|---|---|
| JP | 2012-065092 A | 3/2012 | |
| JP | 2013084906 A | 5/2013 | |
| JP | 2019-024062 A | 2/2019 | |
| KR | 20030074813 A | 9/2003 | |
| WO | 03/058813 A1 | 7/2003 | |
| WO | 2012/176392 A1 | 12/2012 | |
| WO | 2016080444 A1 | 5/2016 | |

OTHER PUBLICATIONS

Official Communication issued in International Patent Application No. PCT/JP2020/021307, mailed on Jul. 21, 2020.
Office Action in KR10-2021-7038803, mailed Jan. 30, 2024, 4 pages.

* cited by examiner

WIRING ELECTRODE

CROSS REFERENCE TO RELATED APPLICATIONS

This application claims the benefit of priority to Japanese Patent Application No. 2019-100853 filed on May 30, 2019 and is a Continuation Application of PCT Application No. PCT/JP2020/021307 filed on May 29, 2020. The entire contents of each application are hereby incorporated herein by reference.

BACKGROUND OF THE INVENTION

1. Field of the Invention

The present invention relates to a wiring electrode.

2. Description of the Related Art

Wiring electrodes have been used in various electronic components. Japanese Unexamined Patent Application Publication No. 2012-065092 discloses an example of a wiring electrode used in a surface acoustic wave element. The wiring electrode is provided on a substrate. In the wiring electrode, an AlCu layer, a Cu layer, a Ti layer, and an Au layer are stacked in this order. Each metal layer is formed by lift-off. It is believed that intervention of the Cu layer and the Ti layer between the AlCu layer and the Au layer allows inhibition of alloy formation by Al in the AlCu layer and Au in the Au layer due to metal diffusion.

In the wiring electrode of Japanese Unexamined Patent Application Publication No. 2012-065092, alloy formation due to mutual metal diffusion between principal surfaces of the AlCu layer and the Au layer can be inhibited. However, at the time of formation of the metal layers by lift-off, Au from which the Au layer is made may travel around to a side surface of the already-formed AlCu layer. For this reason, alloy formation may occur between the side surface of the AlCu layer and Au traveling around thereto. This may increase an electric resistance of the wiring electrode and degrade reliability.

SUMMARY OF THE INVENTION

Preferred embodiments of the present invention provide wiring electrodes that are each able to reduce or prevent alloy formation between metal layers and improve reliability.

A wiring electrode according to a preferred embodiment of the present invention is provided on a substrate and includes a plurality of layers that are stacked. The wiring electrode includes an adhesive layer in contact with the substrate, an outermost layer indirectly above the adhesive layer, a low-resistance layer between the adhesive layer and the outermost layer, including a first principal surface located on a side closer to the adhesive layer and a second principal surface facing the first principal surface, and is lowest in electric resistance among the plurality of layers, and a barrier layer between the low-resistance layer and the outermost layer. The adhesive layer, the low-resistance layer, the barrier layer, and the outermost layer each include an outer peripheral edge. An outer peripheral edge of the second principal surface of the low-resistance layer is located inside the outer peripheral edge of the barrier layer, and the outer peripheral edge of the adhesive layer is located outside the outer peripheral edge of the low-resistance layer, in plan view.

The wiring electrodes according to preferred embodiments of the present invention are able to reduce or prevent alloy formation between metal layers and improve reliability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be illustrated below by describing specific preferred embodiments of the present invention with reference to the drawings.

Note that preferred embodiments described in the present specification are illustrative and that partial replacement or combination of components can be made between different preferred embodiments.

Figure 1:
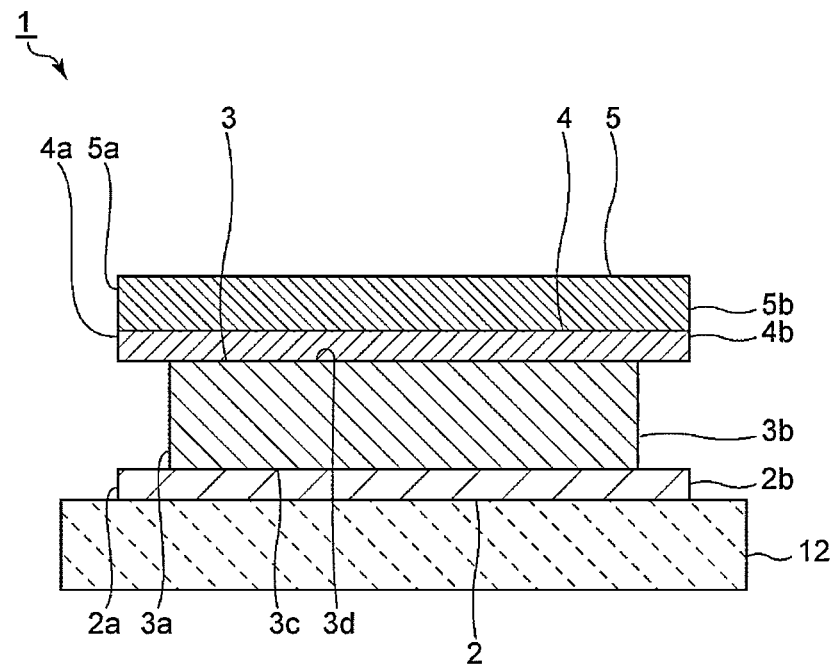
FIG. 1 is a transverse sectional view of a wiring electrode according to a first preferred embodiment of the present invention.
Figure 2:
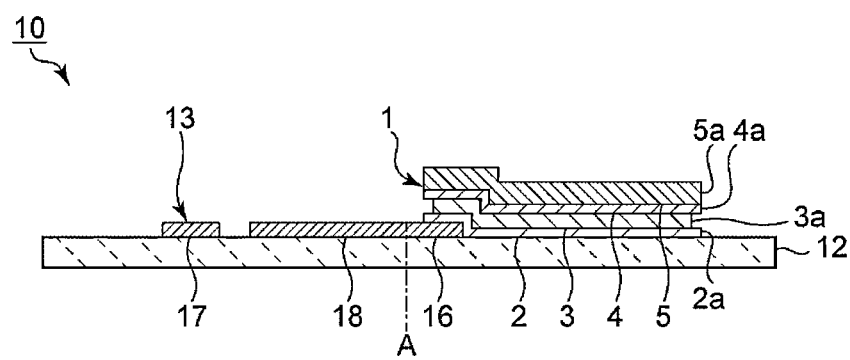
FIG. 2 is a sectional view, taken along a direction in which electrode fingers of an IDT electrode extend, of an acoustic wave device including the wiring electrode according to the first preferred embodiment of the present invention.

FIG. 1 is a transverse sectional view of a wiring electrode according to a first preferred embodiment of the present invention. FIG. 2 is a sectional view, which is taken along a direction in which electrode fingers of an IDT electrode extend, of an acoustic wave device including the wiring electrode according to the first preferred embodiment. An alternate long and short dash line A in FIG. 2 indicates a boundary between a first busbar and first electrode fingers of the IDT electrode (to be described later). Alternate long and short dash lines A in sectional views other than FIG. 2 indicate the same or similar boundaries. Note that a transverse section in FIG. 1 is a section taken along an acoustic wave propagation direction (to be described later).

As shown in FIG. 1, a wiring electrode 1 is provided on a piezoelectric substrate 12. The wiring electrode 1 includes a plurality of layers that are stacked. As shown in FIG. 2, the wiring electrode 1 according to the present preferred embodiment is used in an acoustic wave device 10 including the piezoelectric substrate 12. The piezoelectric substrate 12 only includes a piezoelectric layer. For the piezoelectric layer, for example, lithium tantalate, lithium niobate, zinc oxide, aluminum nitride, crystal, or PZT can be used. Note that the piezoelectric substrate 12 may include a multilayer body including a piezoelectric layer and a different layer.

A wiring electrode according to a preferred embodiment of the present invention can also be used in an electronic component other than an acoustic wave device. In this case, the wiring electrode may be provided on a substrate other than a piezoelectric substrate. Even in a case where a wiring electrode is used in an acoustic wave device or the like, the wiring electrode may be provided on a substrate other than a piezoelectric substrate.

As shown in FIGS. 1 and 2, the wiring electrode 1 includes an adhesive layer 2 which is in contact with the piezoelectric substrate 12, a low-resistance layer 3 which is provided on the adhesive layer 2, a barrier layer 4 which is provided on the low-resistance layer 3, and an outermost layer 5 which is provided on the barrier layer 4.

The adhesive layer 2 adhesively bonds the wiring electrode 1 and the piezoelectric substrate 12 together. The low-resistance layer 3 has the lowest electric resistance among a plurality of layers of the wiring electrode 1. The outermost layer 5 is indirectly provided above the adhesive layer 2 and is located at an uppermost layer of the plurality of layers of the wiring electrode 1. Note that an upper layer in the present specification refers to a layer on an upper side in FIG. 1. The barrier layer 4 is provided between the low-resistance layer 3 and the outermost layer 5 and prevents mutual diffusion and alloy formation by a metal in the low-resistance layer 3 and a metal in the outermost layer 5.

Figure 3:
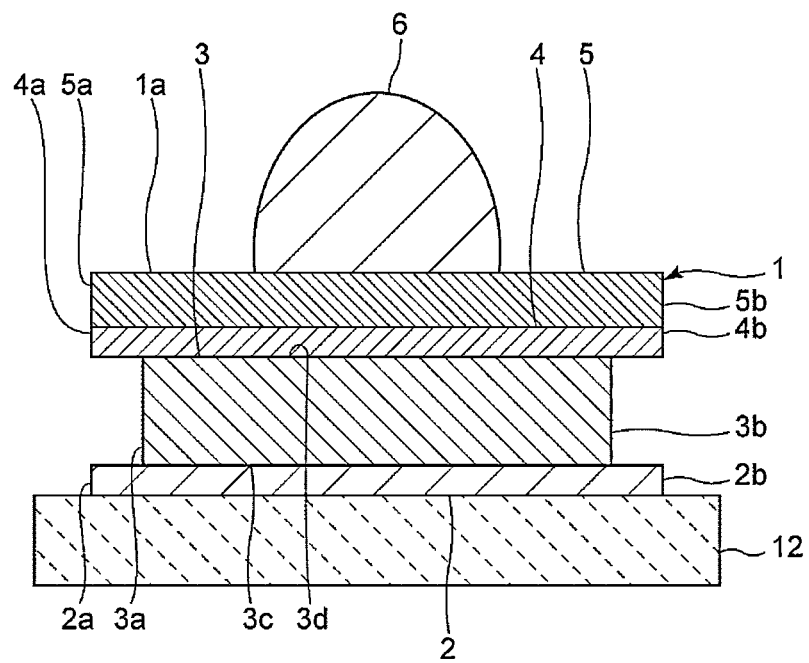
FIG. 3 is a transverse sectional view of the wiring electrode according to the first preferred embodiment of the present invention showing a state in which a bump is provided on the wiring electrode.

FIG. 3 is a transverse sectional view of the wiring electrode according to the first preferred embodiment showing a state in which a bump is provided on the wiring electrode.

The wiring electrode 1 includes a bump pad portion 1a. A bump 6 is provided on the outermost layer 5 in the bump pad portion 1a. The bump 6 shown in FIG. 3 is, for example, an Au bump.

Materials and film thicknesses of the respective layers of the wiring electrode 1 of the present preferred embodiment are as follows.

The adhesive layer 2: A material therefor is Ti, and a film thickness is about 50 nm.

The low-resistance layer 3: A material therefor is Al, and a film thickness is about 800 nm.

The barrier layer 4: A material therefor is Ti, and a film thickness is about 100 nm.

The outermost layer 5: A material therefor is Au, and a film thickness is about 400 nm.

The materials and film thicknesses of the respective layers of the wiring electrode 1, however, are not limited to the above-described materials and film thicknesses. The adhesive layer 2 is preferably made of, for example, at least one metal selected from the group consisting of Ti, Ni, Cr, and an alloy mainly composed thereof. This achieves favorable improvements in a force of bonding between the wiring electrode 1 and the piezoelectric substrate 12. The low-resistance layer 3 is preferably made of, for example, Al or an alloy mainly including Al. This allows a favorable reduction in an electric resistance of the wiring electrode 1. Note that the low-resistance layer 3 may be made of, for example, Cu. The outermost layer 5 is preferably made of, for example, Au or an alloy mainly including Au. This allows favorable bonding of an Au bump or the like to the wiring electrode 1. Note that the outermost layer 5 may be made of, for example, Pt.

As shown in FIG. 1, the low-resistance layer 3 includes an outer peripheral edge 3a. In the present specification, an outer peripheral edge refers to an outer peripheral edge when viewed in plan view. The phrase "in plan view" refers to viewing from the upper side in FIG. 1. The low-resistance layer 3 includes a first principal surface 3c which is located on a side closer to the adhesive layer 2, a second principal surface 3d which faces the first principal surface 3c, and side surfaces 3b which are connected to the first principal surface 3c and the second principal surface 3d. In the present preferred embodiment, the side surfaces 3b of the low-resistance layer 3 extend in a direction perpendicular or substantially perpendicular to principal surfaces of the piezoelectric substrate 12. The outer peripheral edge 3a of the low-resistance layer 3 is located at the side surfaces 3b.

Note that the side surfaces 3b may extend obliquely with respect to the direction perpendicular or substantially perpendicular to the principal surfaces of the piezoelectric substrate 12. Alternatively, each side surface 3b may include a curved surface. In such cases, the outer peripheral edge 3a of the low-resistance layer 3 is located at outermost portions of the side surfaces 3b. Assume here a length in a direction perpendicular or substantially perpendicular to a thickness direction of the wiring electrode 1 at the transverse section of the wiring electrode 1 shown in FIG. 1 as a width. For example, if the side surface 3b extends obliquely such that a width of the low-resistance layer 3 decreases toward the piezoelectric substrate 12, an outer peripheral edge of the second principal surface 3d corresponds to the outer peripheral edge 3a of the whole low-resistance layer 3. On the other hand, if the side surface 3b extends obliquely such that the width of the low-resistance layer 3 increases toward the piezoelectric substrate 12, the outer peripheral edge of the second principal surface 3d is located inside the outer peripheral edge 3a of the low-resistance layer 3 in plan view. Since the width of the low-resistance layer 3 is constant or substantially constant in the present preferred embodiment, the outer peripheral edge of the second principal surface 3d corresponds to the outer peripheral edge 3a of the whole low-resistance layer 3.

Similar to the low-resistance layer 3, the adhesive layer 2, the barrier layer 4, and the outermost layer 5 respectively include an outer peripheral edge 2a, an outer peripheral edge 4a, and outer peripheral edge 5a. Also, the adhesive layer 2, the barrier layer 4, and the outermost layer 5 include side surfaces 2b, side surfaces 4b, and side surfaces 5b. In the present preferred embodiment, the side surfaces 2b, the side surfaces 4b, and the side surfaces 5b of the adhesive layer 2, the barrier layer 4, and the outermost layer 5 extend perpendicularly or substantially perpendicularly to the principal surfaces of the piezoelectric substrate 12. Note that the side surfaces 2b, the side surfaces 4b, and the side surfaces 5b may extend obliquely with respect to the direction perpendicular or substantially perpendicular to the principal surfaces of the piezoelectric substrate 12. Alternatively, the side surfaces 2b, the side surfaces 4b, and the side surfaces 5b may each include a curved surface.

As shown in FIGS. 1 and 2, the outer peripheral edge 3a of the low-resistance layer 3 is located inside the outer peripheral edge 4a of the barrier layer 4, and the outer peripheral edge 2a of the adhesive layer 2 is located outside the outer peripheral edge 3a of the low-resistance layer 3. Note that, in plan view, it is only required that the outer peripheral edge of the second principal surface 3d of the low-resistance layer 3 is located inside the outer peripheral edge 4a of the barrier layer 4 and the outer peripheral edge 2a of the adhesive layer 2 is located outside the outer peripheral edge 3a of the low-resistance layer 3.

The outer peripheral edge 2a of the adhesive layer 2, the outer peripheral edge 4a of the barrier layer 4, and the outer peripheral edge 5a of the outermost layer 5 overlap in plan view. Assuming the length in the direction perpendicular or substantially perpendicular to the thickness direction of the wiring electrode 1 at the transverse section of the wiring electrode 1 shown in FIG. 1 as a width, the width of the low-resistance layer 3 is smaller than widths of the adhesive layer 2, the barrier layer 4, and the outermost layer 5.

Figure 4:
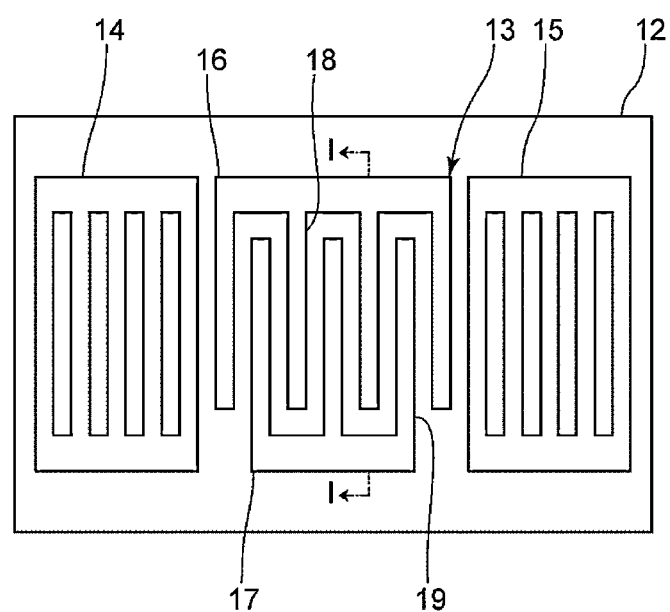
FIG. 4 is a plan view showing the IDT electrode in the acoustic wave device including the wiring electrode according to the first preferred embodiment of the present invention.

FIG. 4 is a plan view showing the IDT electrode in the acoustic wave device including the wiring electrode according to the first preferred embodiment. Note that the wiring electrode is not shown in FIG. 4. A section of the IDT electrode shown in FIG. 2 is a section taken along line I-I in FIG. 4.

As shown in FIGS. 2 and 4, an IDT electrode 13 is provided on the piezoelectric substrate 12. An acoustic wave is excited by applying an AC voltage to the IDT electrode 13. As shown in FIG. 4, one pair of reflectors 14 and 15 is provided on both sides in the acoustic wave propagation direction of the IDT electrode 13 on the piezoelectric substrate 12.

The IDT electrode 13 includes a first busbar 16 and a second busbar 17 which face each other. The IDT electrode 13 includes a plurality of first electrode fingers 18, respective ends of which are connected to the first busbar 16. The IDT electrode 13 also includes a plurality of second electrode fingers 19, respective ends of which are connected to the second busbar 17. The plurality of first electrode fingers 18 and the plurality of second electrode fingers 19 are interdigitated with each other.

As shown in FIG. 2, the wiring electrode 1 is connected to the first busbar 16 of the IDT electrode 13. The wiring electrode 1 extends from on the first busbar 16 onto the piezoelectric substrate 12. Although the wiring electrode 1 is provided on a portion of an upper surface of the first busbar 16 in the present preferred embodiment, the wiring electrode 1 may be provided over the entire or substantially the entire of the upper surface of the first busbar 16.

Note that the wiring electrode 1 may not be directly connected to the IDT electrode 13. The wiring electrode 1 may be electrically connected to the IDT electrode 13 with a different lead wire or the like connected to the IDT electrode 13 which is interposed therebetween. Assume that, if a lead wire or the like is connected to any spot of the side surface 3b of the low-resistance layer 3 in the wiring electrode 1, the lead wire is not included in the side surface 3b. For example, if the wiring electrode 1 is an electrode for external connection which is connected to the IDT electrode 13 by a lead wire, the lead wire is not included in the side surface 3b. That is, the outer peripheral edge 3a of the low-resistance layer 3 is an outer peripheral edge of the side surfaces 3b in a case where no lead wire is connected.

The acoustic wave device 10 according to the present preferred embodiment is an acoustic wave resonator. An acoustic wave device, however, is not limited to an acoustic wave resonator and may be a filter device including a plurality of acoustic wave resonators, a multiplexer including such a filter device, or the like, for example. In this case, a wiring electrode according to a preferred embodiment of the present invention may be connected to each acoustic wave resonator or the like.

A feature of the present preferred embodiment is that the outer peripheral edge 3a of the second principal surface 3d of the low-resistance layer 3 is located inside the outer peripheral edge 4a of the barrier layer 4 in plan view and that the outer peripheral edge 2a of the adhesive layer 2 is located outside the outer peripheral edge 3a of the low-resistance layer 3 in plan view. These features enable effective reduction or prevention of alloy formation and improvement of reliability. Details will be described below together with a non-limiting example of a manufacturing method for the acoustic wave device 10 of the present preferred embodiment.

Figure 6A:
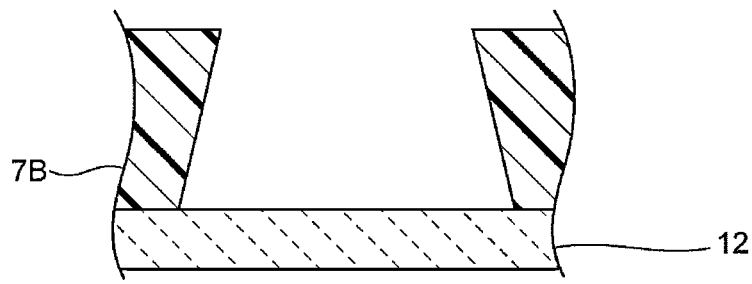
FIGS. 6A and 6B are transverse sectional views for explaining a process of forming a multilayer body of metal layers in a non-limiting example of a method for forming the wiring electrode according to the first preferred embodiment of the present invention.
Figure 6B:
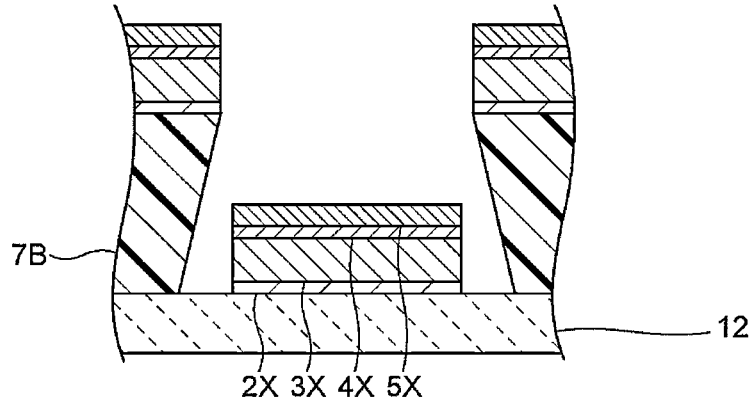
Figure 7A:
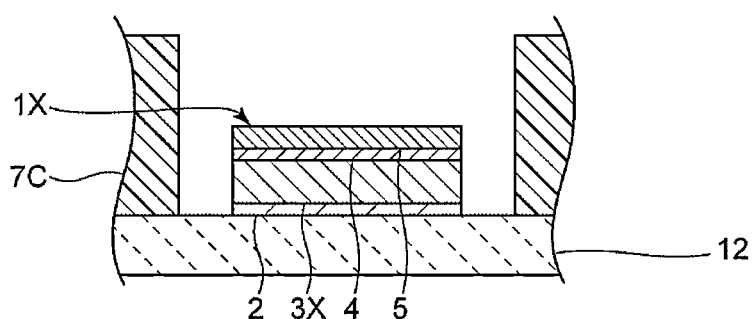
FIGS. 7A and 7B are transverse sectional views for explaining an etching process in the non-limiting example of the method for forming the wiring electrode according to the first preferred embodiment of the present invention.
Figure 7B:
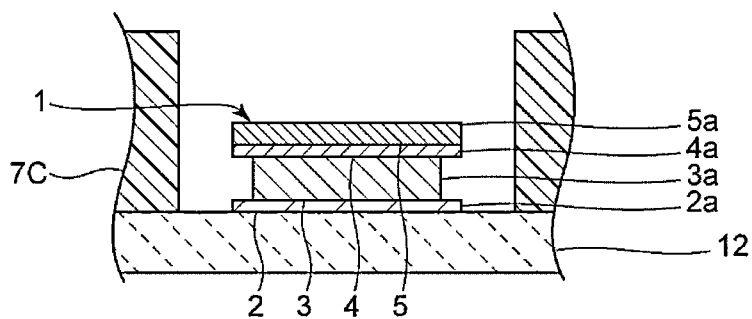

FIGS. 5A to 5E are sectional views showing a portion corresponding to the section shown in FIG. 2 for explaining a non-limiting example of a manufacturing method for the acoustic wave device according to the first preferred embodiment. FIGS. 6A and 6B are transverse sectional views for explaining a process of forming a multilayer body of metal layers in a non-limiting example of a method for forming the wiring electrode according to the first preferred embodiment. FIGS. 7A and 7B are transverse sectional views for explaining an etching process in the non-limiting example of the method for forming the wiring electrode according to the first preferred embodiment.

Figure 5A:
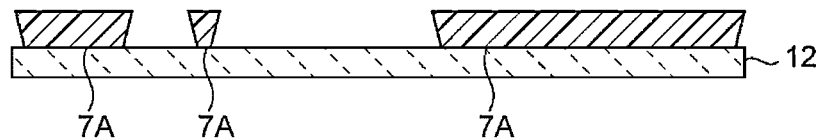
FIGS. 5A to 5E are sectional views showing a portion corresponding to the section shown in FIG. 2 for explaining a non-limiting example of a manufacturing method for the acoustic wave device according to the first preferred embodiment of the present invention.
Figure 5B:
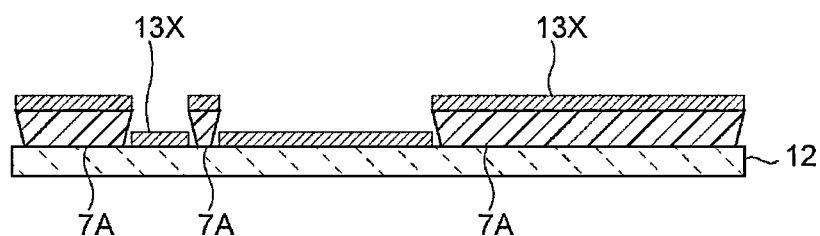
Figure 5C:
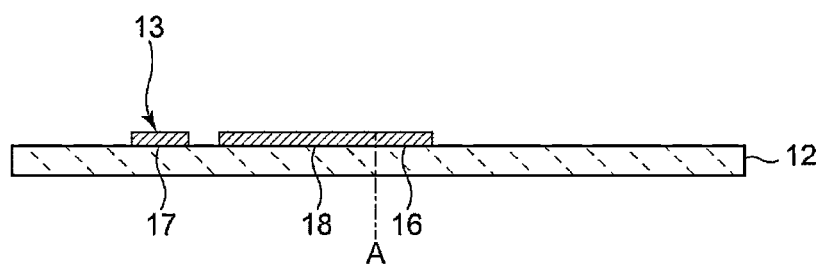

As shown in FIG. 5A, the piezoelectric substrate 12 is prepared. The IDT electrode 13 shown in FIG. 4 is then formed on the piezoelectric substrate 12 by lift-off. More specifically, a resist pattern 7A is formed on the piezoelectric substrate 12. The resist pattern 7A is open at a portion corresponding to a shape of the IDT electrode 13 and portions corresponding to the reflectors 14 and 15. As shown in FIG. 5B, a metal film 13X is then formed on the piezoelectric substrate 12 by, for example, evaporation or sputtering so as to cover the resist pattern 7A. The resist pattern 7A is then peeled off, and the IDT electrode 13 is obtained, as shown in FIG. 5C. The reflectors 14 and 15 are formed concurrently with the IDT electrode 13. Note that a method for forming the IDT electrode 13 and the reflectors 14 and 15 is not limited to the above-described method.

Figure 5D:
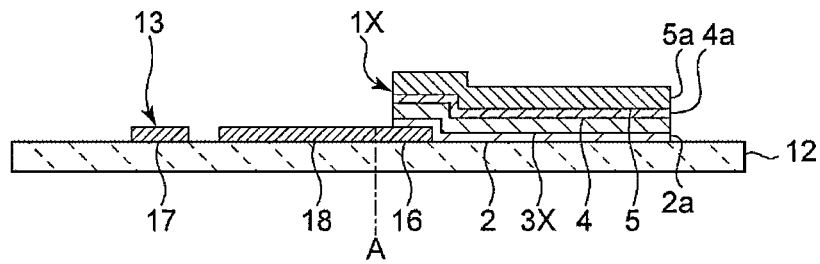

As shown in FIG. 5D, a multilayer body 1X including metal layers is then formed so as to extend from the first busbar 16 of the IDT electrode 13 onto the piezoelectric substrate 12. The multilayer body 1X can be formed by, for example, lift-off. More specifically, a resist pattern 7B is formed on the piezoelectric substrate 12, as shown in FIG. 6A. As shown in FIG. 6B, a metal layer 2X to define and function as the adhesive layer 2 is then formed. A metal layer 3X to define and function as the low-resistance layer 3 is then stacked on the metal layer 2X. A metal layer 4X to define and function as the barrier layer 4 is then stacked on the metal layer 3X. A metal layer 5X to define and function as the outermost layer 5 is then stacked on the metal layer 4X. The metal layer 2X, the metal layer 3X, the metal layer 4X, and the metal layer 5X can be formed by, for example, evaporation or sputtering. The resist pattern 7B is then peeled off. With these operations, the multilayer body 1X shown in FIG. 5D of the adhesive layer 2, the metal layer 3X to define and function as the low-resistance layer 3, the barrier layer 4, and the outermost layer 5 is obtained.

As shown in FIG. 7A, a resist pattern 7C is then formed on the piezoelectric substrate 12 so as not to cover side surfaces of the layers of the multilayer body 1X. The side surfaces of the metal layer 3X to define and function as the low-resistance layer 3 is then etched. As an etchant at this time, an etchant which acts on the metal layer 3X to define and function as the low-resistance layer 3 and acts poorly on the adhesive layer 2, the barrier layer 4, and the outermost layer 5 is used. More specifically, a liquid mixture of, for example, acetic acid, phosphoric acid, and nitric acid is used as an etchant at the time of formation of the wiring electrode 1. The type of the etchant is not limited to the above-described etchant.

Figure 5E:
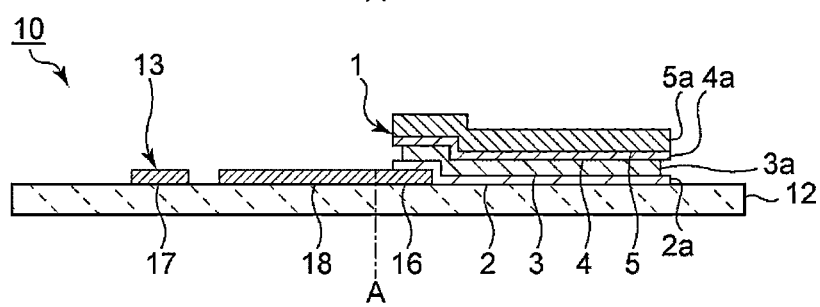

With the etching of the side surfaces of the metal layer 3X, the low-resistance layer 3, the outer peripheral edge 3a of which is located inside the outer peripheral edge 4a of the barrier layer 4, is obtained, as shown in FIG. 7B. The resist pattern 7C is then peeled off. With this peeling, the wiring electrode 1 of the first preferred embodiment is obtained, as shown in FIG. 5E. After that, for example, a process involving heating, such as a process of bonding the bump 6 to the wiring electrode 1, may be performed.

In, for example, a case where the bump 6 is bonded to the outermost layer 5 of the wiring electrode 1, the outermost layer 5 is heated and expands easily. Additionally, at the time of bonding of the bump 6, heavy weight is often added to the outermost layer 5 or ultrasonic vibration may be applied. For this reason, especially at the time of bonding the bump 6 to the outermost layer 5, a portion of the expanded outermost layer 5 may extend beyond the outer peripheral edge 4a of the barrier layer 4 to hang down toward the piezoelectric substrate 12. In a conventional case where an outer peripheral edge of a low-resistance layer overlaps with an outer peripheral edge of a barrier layer in plan view, a portion of an outermost layer may hang down to side surfaces of the low-resistance layer. For this reason, a metal from which the low-resistance layer is made and a metal from which the outermost layer is made may form an alloy to increase an electric resistance of a wiring electrode.

In contrast, in the present preferred embodiment, the outer peripheral edge 3a of the second principal surface 3d of the low-resistance layer 3 is located inside the outer peripheral edge 4a of the barrier layer 4 in plan view, as shown in FIG. 1. For this reason, even if the outermost layer 5 is heated and expands, a metal from which the outermost layer 5 is made is unlikely to extend to the side surfaces 3b of the low-resistance layer 3. It is thus possible to effectively reduce or prevent alloy formation by a metal from which the low-resistance layer 3 is made and the metal, from which the outermost layer 5 is made. This enables reduction or prevention of an increase in the electric resistance of the wiring electrode 1 and improvement of the reliability.

The outer peripheral edge 3a of the low-resistance layer 3 is preferably located inside the outer peripheral edge 4a of the barrier layer 4. With this configuration, the metal, from which the outermost layer 5 is made, is much more unlikely to extend to the side surfaces 3b of the low-resistance layer 3. It is thus possible to much more greatly reduce or prevent alloy formation by the metal, from which the low-resistance layer 3 is made, and the metal, from which the outermost layer 5 is made.

Figure 8:
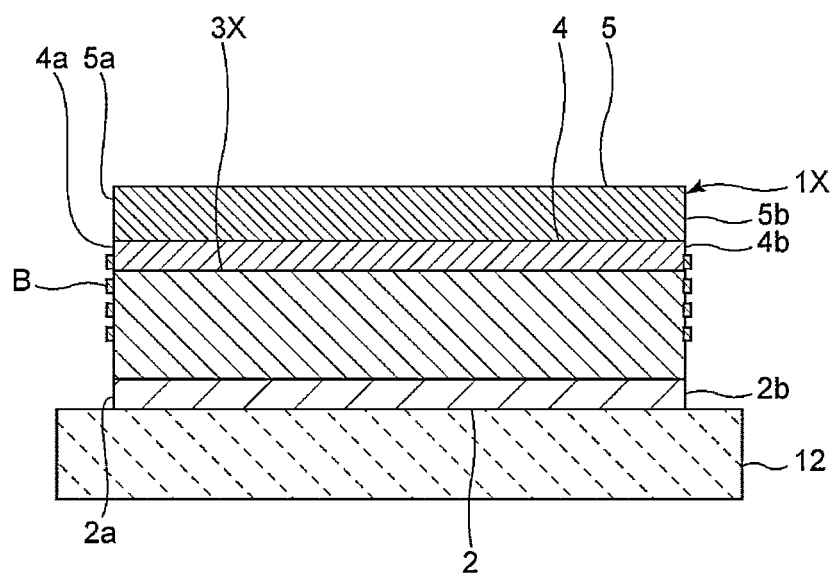
FIG. 8 is a transverse sectional view of a wiring electrode showing how a metal of which an outermost layer is made is attached to a metal layer to define and function as a low-resistance layer of the wiring electrode.

In a process of forming the multilayer body 1X to define and function as the wiring electrode 1, the metal layer 5X to define and function as the outermost layer 5 is stacked on the metal layer 4X after the metal layer 3X to define and function as the low-resistance layer 3 and the metal layer 4X to define and function as the barrier layer 4 are formed, as shown in FIG. 6B. At this time, the metal for forming the outermost layer 5 may travel around to the side surfaces of the metal layer 3X to define and function as the low-resistance layer 3. In this case, even after the resist pattern 7B is peeled off, the metal, from which the outermost layer 5 is made, may be in a state of being attached to the side surfaces of the metal layer 3X. FIG. 8 shows how a metal B from which the outermost layer 5 is made is attached to the side surfaces of the metal layer 3X of the multilayer body 1X. If a process involving heating is performed in a state where the metal B is attached to the side surfaces of the metal layer 3X, a metal from which the metal layer 3X is made and the metal B may form an alloy to increase an electric resistance of a wiring electrode.

In contrast, at the time of formation of the wiring electrode 1 of the present preferred embodiment, even if the metal B is attached to the side surfaces of the metal layer 3X, the side surfaces of the metal layer 3X are etched, as shown in FIGS. 7A and 7B. With this etching, the metal B is removed from the side surfaces of the metal layer 3X. The metal B is unlikely to remain at the side surfaces 3b of the formed low-resistance layer 3. It is thus possible to much more greatly reduce or prevent alloy formation by the metal, from which the low-resistance layer 3 is made, and the metal, from which the outermost layer 5 is made.

Additionally, as shown in FIG. 1, the outer peripheral edge 2a of the adhesive layer 2 is located outside the outer peripheral edge 3a of the low-resistance layer 3, which allows an increase in an area of the adhesive layer 2. The force of bonding between the wiring electrode 1 and the piezoelectric substrate 12 can be improved. It is thus possible to much more greatly improve the reliability.

As shown in FIG. 3, the outer peripheral edge 5a of the outermost layer 5 is located outside the outer peripheral edge 3a of the low-resistance layer 3 in the wiring electrode 1. With this configuration, an area of bonding between the wiring electrode 1 and the bump 6 can be increased. It is thus possible to improve a force of bonding between the wiring electrode 1 and an external electrode or the like. This allows much more effective improvement of the reliability.

Moreover, the outer peripheral edge 5a of the outermost layer 5 and the outer peripheral edge 4a of the barrier layer 4 overlap in plan view. As described above, since the outer peripheral edge 5a of the outermost layer 5 is not located outside the outer peripheral edge 4a of the barrier layer 4, the metal, from which the outermost layer 5 is made, can be effectively reduced or prevented from reaching the side surfaces 3b of the low-resistance layer 3 due to, for example, expansion by heat, and weight addition and ultrasonic vibration. It is thus possible to effectively reduce or prevent alloy formation by the metal, from which the low-resistance layer 3 is made, and the metal, from which the outermost layer 5 is made. Meanwhile, since the outer peripheral edge 5a of the outermost layer 5 is not located inside the outer peripheral edge 4a of the barrier layer 4, an area of bonding between the outermost layer 5 and the bump 6 can be increased. It is thus possible to much more greatly improve the force of bonding with the external electrode or the like and much more effectively improve the reliability.

The configuration of the present preferred embodiment has been described in sectional view taken along the acoustic wave propagation direction or a direction in which electrode fingers extend, as in FIG. 1, 2, or the like. Even if the configuration in FIG. 1 is provided in sectional view taken along a direction other than the directions, the same or substantially the same advantageous effects as described above can be obtained. More specifically, alloy formation by the metal, from which the low-resistance layer 3 is made, and the metal, from which the outermost layer 5 is made, can be inhibited, and the reliability can be improved.

In the present preferred embodiment, the side surfaces 3b of the low-resistance layer 3 extend in the direction perpendicular or substantially perpendicular to the principal surfaces of the piezoelectric substrate 12. The shape of the side surface 3b of the low-resistance layer 3, however, is not limited to the above-described one. First to third modifications of the first preferred embodiment which are different only in a shape of a side surface of a low-resistance layer from the first preferred embodiment will be illustrated below. In the first to third modifications, it is possible to reduce or prevent alloy formation by a metal from which a low-resistance layer is made and a metal from which an outermost layer is made and improve reliability, as in the first preferred embodiment.

Figure 9:
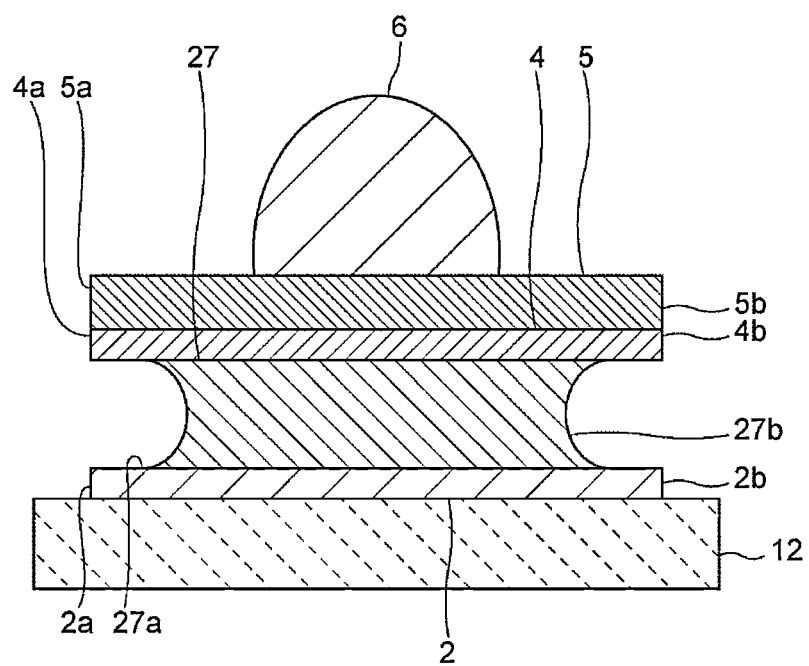
FIG. 9 is a transverse sectional view of a wiring electrode according to a first modification of the first preferred embodiment of the present invention.

As shown in FIG. 9, in the first modification, side surfaces 27b of a low-resistance layer 27 each include a curved surface. More specifically, in the low-resistance layer 27, a width is the largest at a portion where the low-resistance layer 27 is in contact with the adhesive layer 2 or a portion where the low-resistance layer 27 is in contact with the barrier layer 4. In a transverse section of a wiring electrode shown in FIG. 9, an outer peripheral edge 27a of the low-resistance layer 27 is located at the portion where the low-resistance layer 27 is in contact with the adhesive layer 2 or the portion where the low-resistance layer 27 is in contact with the barrier layer 4.

Figure 10:
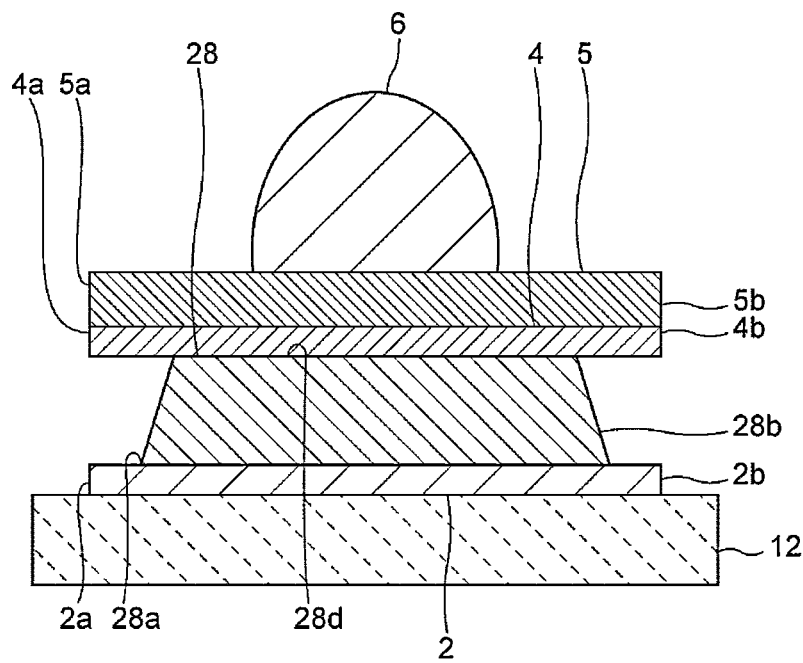
FIG. 10 is a transverse sectional view of a wiring electrode according to a second modification of the first preferred embodiment of the present invention.

As shown in FIG. 10, in the second modification, side surfaces 28b of a low-resistance layer 28 extend obliquely with respect to a direction perpendicular or substantially perpendicular to principal surfaces of the piezoelectric substrate 12. More specifically, the side surfaces 28b of the low-resistance layer 28 extend obliquely such that a width of the low-resistance layer 28 increases toward the piezoelectric substrate 12. In a transverse section of a wiring electrode shown in FIG. 10, an outer peripheral edge 28a of the low-resistance layer 28 is located at a portion where the low-resistance layer 28 is in contact with the adhesive layer 2. An outer peripheral edge of a first principal surface of the low-resistance layer 28 corresponds to an outer peripheral edge of the entire or substantially the entire low-resistance layer 28. Note that, at the time of formation of the wiring electrode of the second modification, for example, the barrier layer 4 and the outermost layer 5 may be formed after the low-resistance layer 28, in which the side surfaces 28b extend obliquely with respect to the direction perpendicular or substantially perpendicular to the principal surfaces of the piezoelectric substrate 12, is formed.

Figure 11:
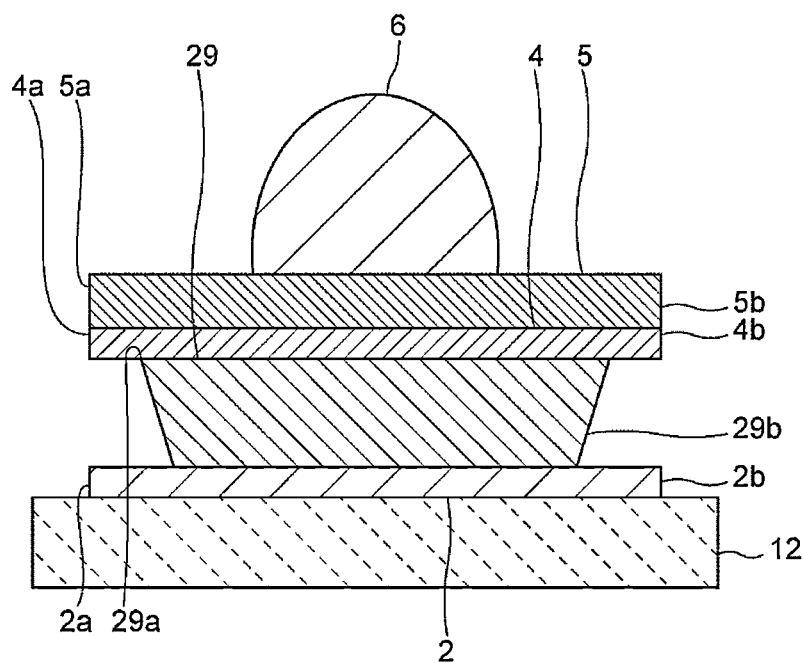
FIG. 11 is a transverse sectional view of a wiring electrode according to a third modification of the first preferred embodiment of the present invention.

As shown in FIG. 11, in the third modification, side surfaces 29b of a low-resistance layer 29 extend obliquely with respect to a direction perpendicular to principal surfaces of the piezoelectric substrate 12. More specifically, the side surfaces 29b of the low-resistance layer 29 extend obliquely such that a width of the low-resistance layer 29 decreases toward the piezoelectric substrate 12. In a transverse section of a wiring electrode shown in FIG. 11, an outer peripheral edge 29a of the low-resistance layer 29 is located at a portion where the low-resistance layer 29 is in contact with the barrier layer 4. An outer peripheral edge of a second principal surface of the low-resistance layer 29 corresponds to the outer peripheral edge 29a of the entire or substantially the entire low-resistance layer 29. Note that, at the time of formation of the wiring electrode of the third modification, for example, the barrier layer 4 and the outermost layer 5 may be formed after the low-resistance layer 29, in which the side surfaces 29b extend obliquely with respect to the direction perpendicular or substantially perpendicular to the principal surfaces of the piezoelectric substrate 12, is formed.

Figure 12:
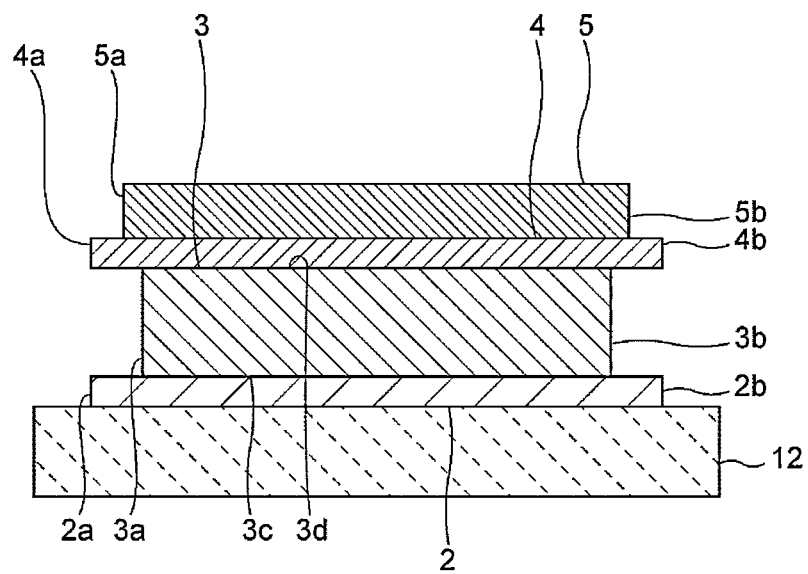
FIG. 12 is a transverse sectional view of a wiring electrode according to a second preferred embodiment of the present invention.

FIG. 12 is a transverse sectional view of a wiring electrode according to a second preferred embodiment of the present invention.

The present preferred embodiment is different from the first preferred embodiment in that an outer peripheral edge 5a of an outermost layer 5 is located inside an outer peripheral edge 4a of a barrier layer 4. Except for the above-described point, the wiring electrode of the present preferred embodiment has the same or substantially the same configuration as in the wiring electrode 1 of the first preferred embodiment. Note that the outer peripheral edge 5a of the outermost layer 5 is located outside an outer peripheral edge 3a of a low-resistance layer 3.

As described above, the outer peripheral edge 5a of the outermost layer 5 is located inside the outer peripheral edge 4a of the barrier layer 4. For this reason, even if the outermost layer 5 expands by application of heat at the time of, for example, bump formation, a portion of the expanded outermost layer 5 can be reduced or prevented from extending beyond the outer peripheral edge 4a of the barrier layer 4 to hang down toward a piezoelectric substrate 12. It is thus possible to effectively reduce or prevent alloy formation by the metal, from which the low-resistance layer 3 is made, and the metal, from which the outermost layer 5 is made. This allows effective reduction or prevention of an increase in a resistance of the wiring electrode and effective improvement of reliability.

Additionally, an outer peripheral edge 2a of an adhesive layer 2 is located outside the outer peripheral edge 3a of the low-resistance layer 3, as in the first preferred embodiment, which enables an increase in an area of the adhesive layer 2. It is thus possible to improve a force of bonding between the wiring electrode and the piezoelectric substrate 12 and much more greatly improve the reliability.

Figure 13:
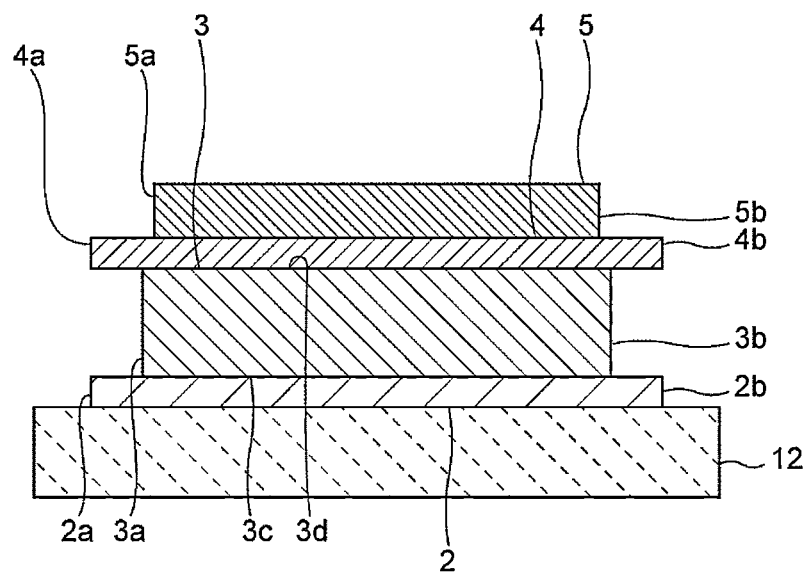
FIG. 13 is a transverse sectional view of a wiring electrode according to a third preferred embodiment of the present invention.

FIG. 13 is a transverse sectional view of a wiring electrode according to a third preferred embodiment of the present invention.

The present preferred embodiment is different from the second preferred embodiment in that an outer peripheral edge 5a of an outermost layer 5 is located inside an outer peripheral edge 3a of a low-resistance layer 3. Except for the above-described point, the wiring electrode of the present preferred embodiment has the same or substantially the same configuration as in the wiring electrode of the second preferred embodiment.

As shown in FIG. 13, the outer peripheral edge 5a of the outermost layer 5 is located inside an outer peripheral edge 4a of a barrier layer 4 and is further located inside the outer peripheral edge 3a of the low-resistance layer 3. For this reason, even if the outermost layer 5 expands by application of heat at the time of, for example, bump formation, a portion of the expanded outermost layer 5 can be effectively reduced or prevented from extending beyond the outer peripheral edge 4a of the barrier layer 4 to hang down toward a piezoelectric substrate 12. It is thus possible to much more greatly reduce or prevent alloy formation by the metal, from which the low-resistance layer 3 is made, and the metal, from which the outermost layer 5 is made. This enables much greater reduction or prevention of an increase in a resistance of the wiring electrode and much greater improvement of reliability.

Additionally, an outer peripheral edge 2a of an adhesive layer 2 is located outside the outer peripheral edge 3a of the low-resistance layer 3, as in the second preferred embodiment, which enables an increase in an area of the adhesive layer 2. It is thus possible to improve a force of bonding between the wiring electrode and the piezoelectric substrate 12 and much more effectively improve the reliability.

Figure 14:
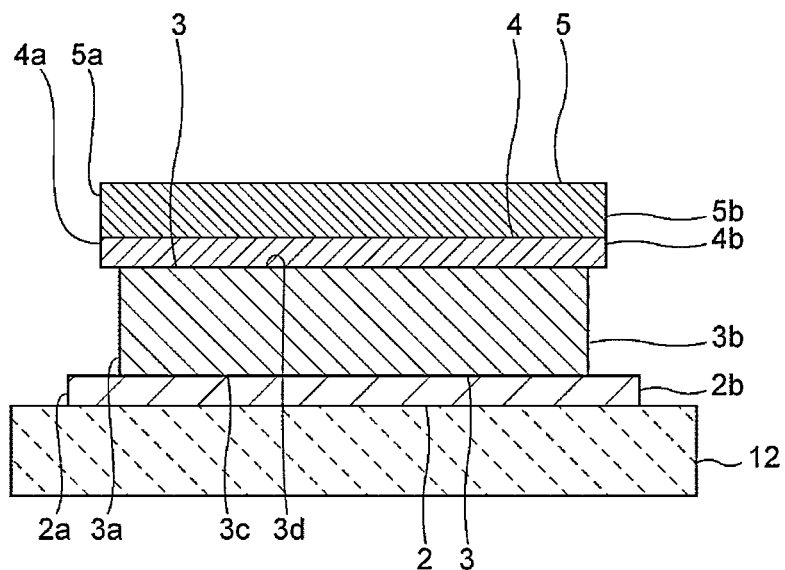
FIG. 14 is a transverse sectional view of a wiring electrode according to a fourth preferred embodiment of the present invention.

FIG. 14 is a transverse sectional view of a wiring electrode according to a fourth preferred embodiment of the present invention.

The present preferred embodiment is different from the first preferred embodiment in that an outer peripheral edge 5a of an outermost layer 5 and an outer peripheral edge 4a of a barrier layer 4 are located inside an outer peripheral edge 2a of an adhesive layer 2. Except for the above-described point, the wiring electrode of the present preferred embodiment has the same or substantially the same configuration as in the wiring electrode 1 of the first preferred embodiment. Note that the outer peripheral edge 4a of the barrier layer 4 and the outer peripheral edge 5a of the outermost layer 5 overlap in plan view.

As shown in FIG. 14, since the outer peripheral edge 4a of the barrier layer 4 is located inside the outer peripheral edge 2a of the adhesive layer 2, a width of a portion where the barrier layer 4 is not in contact with the low-resistance layer 3 is small. With this configuration, the barrier layer 4 and the outermost layer 5 can be reduced or prevented from hanging down toward a piezoelectric substrate 12. It is thus possible to effectively reduce or prevent alloy formation by the metal, from which the low-resistance layer 3 is made, and the metal, from which the outermost layer 5 is made. This enables effective reduction or prevention of an increase in a resistance of the wiring electrode and effective improvement of reliability.

Additionally, the outer peripheral edge 2a of the adhesive layer 2 is located outside an outer peripheral edge 3a of the low-resistance layer 3, as in the first preferred embodiment, which enables an increase in an area of the adhesive layer 2. It is thus possible to improve a force of bonding between the wiring electrode and the piezoelectric substrate 12 and much more greatly improve the reliability.

In the present preferred embodiment, side surfaces 2b of the adhesive layer 2, side surfaces 4b of the barrier layer 4, and side surfaces 5b of the outermost layer 5 extend in a direction perpendicular or substantially perpendicular to principal surfaces of the piezoelectric substrate 12. Note that the side surfaces 2b, the side surfaces 4b, and the side surfaces 5b may extend obliquely with respect to the direction perpendicular or substantially perpendicular to the principal surfaces of the piezoelectric substrate 12, for example.

Figure 15:
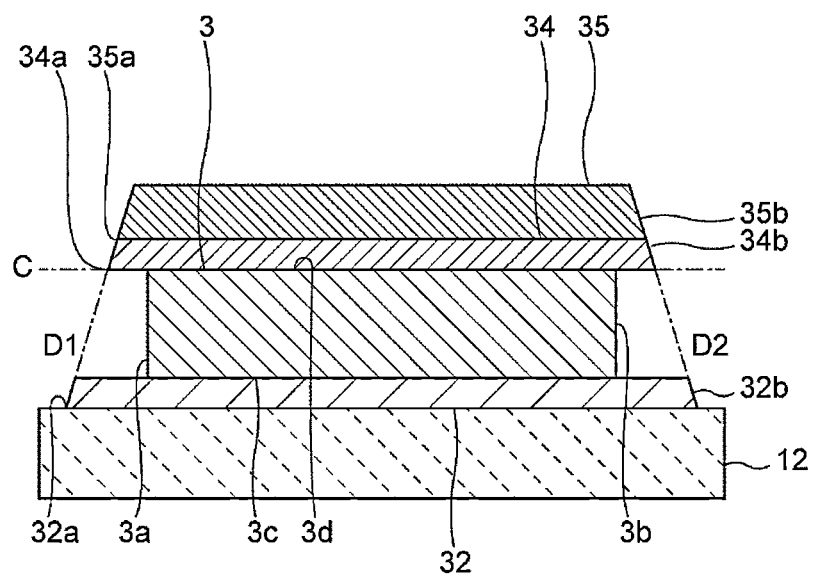
FIG. 15 is a transverse sectional view of a wiring electrode according to a first modification of the fourth preferred embodiment of the present invention.

FIG. 15 is a transverse sectional view of a wiring electrode according to a first modification of the fourth preferred embodiment.

In the first modification of the fourth preferred embodiment, side surfaces 32b of an adhesive layer 32, side surfaces 34b of a barrier layer 34, and side surfaces 35b of an outermost layer 35 extend obliquely with respect to a direction perpendicular or substantially perpendicular to principal surfaces of the piezoelectric substrate 12. More specifically, the side surfaces 32b of the adhesive layer 32, the side surfaces 34b of the barrier layer 34, and the side surfaces 35b of the outermost layer 35 extend obliquely such that respective widths of the adhesive layer 32, the barrier layer 34, and the outermost layer 35 increase toward the piezoelectric substrate 12. In a transverse section of the wiring electrode shown in FIG. 15, an outer peripheral edge 32a of the adhesive layer 32 is located at a portion where the adhesive layer 32 is in contact with the piezoelectric substrate 12. An outer peripheral edge 34a of the barrier layer 34 is located on an extended line C in a width direction of a portion where the barrier layer 34 is in contact with the low-resistance layer 3. An outer peripheral edge 35a of the outermost layer 35 is located at a portion where the outermost layer 35 is in contact with the barrier layer 34.

In the transverse section shown in FIG. 15, the adhesive layer 32 includes one pair of side surfaces 32b facing each other. The same applies to the low-resistance layer 3, the barrier layer 34, and the outermost layer 35. One of the side surfaces 32b of the adhesive layer 32, one of the side surfaces 34b of the barrier layer 34, and one of the side surfaces 35b of the outermost layer 35 are located on a linear imaginary line D1 shown in FIG. 15. The other of the side surfaces 32b of the adhesive layer 32, the other of the side surfaces 34b of the barrier layer 34, and the other of the side surfaces 35b of the outermost layer 35 are located on a linear imaginary line D2 shown in FIG. 15. The side surfaces 3b of the low-resistance layer 3 are located inside the imaginary lines D1 and D2. In the present modification, it is possible to much more greatly reduce or prevent alloy formation by a metal from which the low-resistance layer 3 is made and a metal from which the outermost layer 35 is made and improve reliability, as in the fourth preferred embodiment. Note that, in a case where the side surfaces 32b of the adhesive layer 32, the side surfaces 34b of the barrier layer 34, and the side surfaces 35b of the outermost layer 35 extend obliquely with respect to the direction perpendicular or substantially perpendicular to the principal surfaces of the piezoelectric substrate 12, the side surfaces 32b, the side surfaces 34b, and the side surfaces 35b need not be located on linear imaginary lines.

Figure 16:
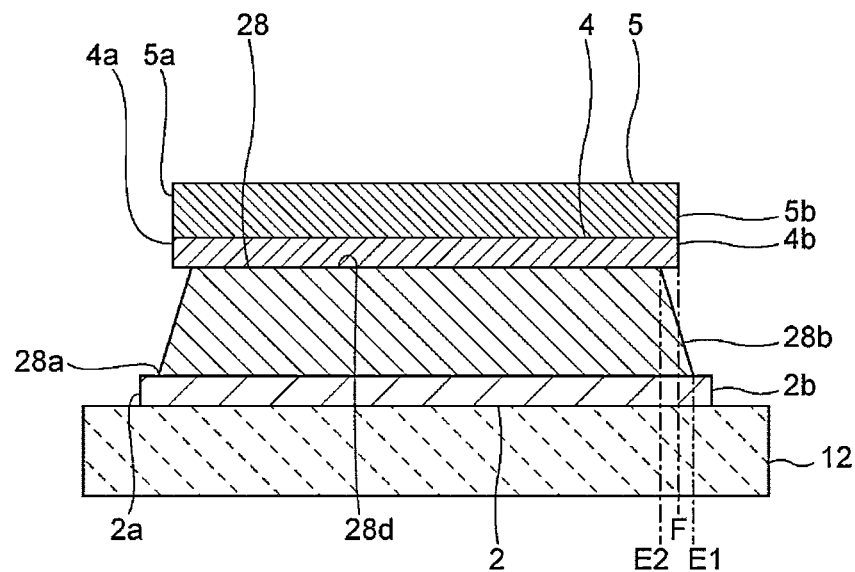
FIG. 16 is a transverse sectional view of a wiring electrode according to a second modification of the fourth preferred embodiment of the present invention.

FIG. 16 is a transverse sectional view of a wiring electrode according to a second modification of the fourth preferred embodiment. An alternate long and short dash line E1 in FIG. 16 indicates a position of an outer peripheral edge of a low-resistance layer, and an alternate long and short dash line E2 indicates a position of an outer peripheral edge of a second principal surface of the low-resistance layer. An alternate long and short dash line F indicates a position of an outer peripheral edge of a barrier layer.

In the second modification of the fourth preferred embodiment, side surfaces 28b of a low-resistance layer 28 extend obliquely such that a width of the low-resistance layer 28 increases toward the piezoelectric substrate 12. In the present modification, an outer peripheral edge 28a (the position indicated by the alternate long and short dash line E1 in FIG. 16) of the low-resistance layer 28 is located outside the outer peripheral edge 4a (the position indicated by the alternate long and short dash line F in FIG. 16) of the barrier layer 4. Meanwhile, as in the fourth preferred embodiment, in plan view, an outer peripheral edge (the position indicated by the alternate long and short dash line E2 in FIG. 16) of a second principal surface 28d of the low-resistance layer 28 is located inside the outer peripheral edge 4a of the barrier layer 4, and the outer peripheral edge 2a of the adhesive layer 2 is located outside the outer peripheral edge 28a of the low-resistance layer 28. In this case, alloy formation by a metal from which the low-resistance layer 28 is made and a metal from which the outermost layer 5 is made can be reduced or prevented, and reliability can be improved.

Figure 17:
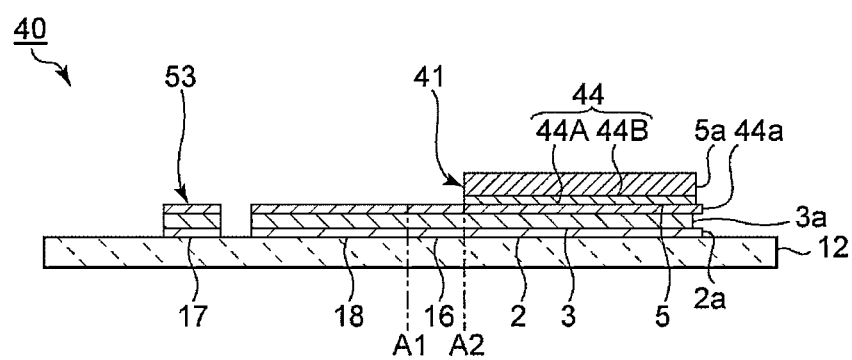
FIG. 17 is a sectional view, which is taken along a direction in which electrode fingers of an IDT electrode extend, of an acoustic wave device including a wiring electrode according to a fifth preferred embodiment of the present invention.
Figure 18:
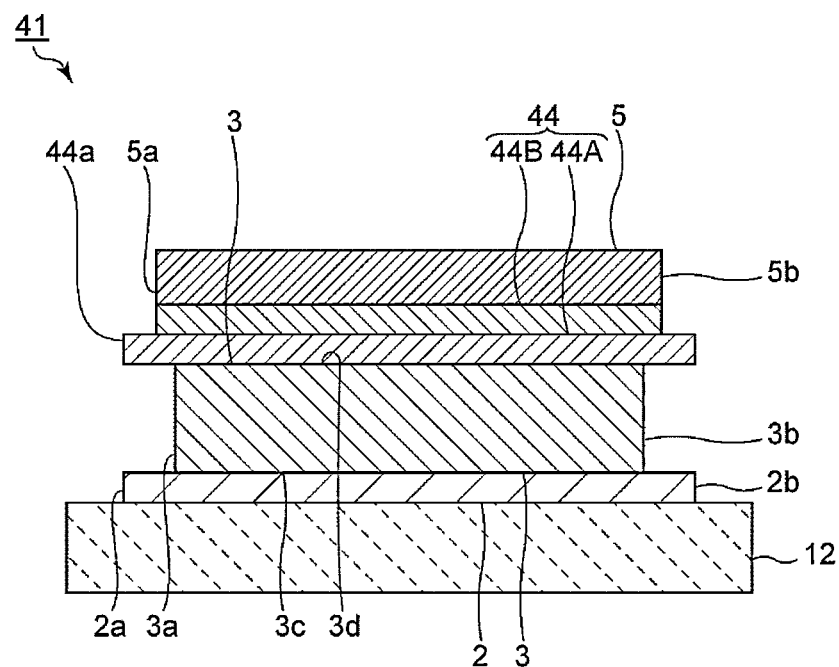
FIG. 18 is a transverse sectional view of the wiring electrode according to the fifth preferred embodiment of the present invention.

FIG. 17 is a sectional view, which is taken along a direction in which electrode fingers of an IDT electrode extend, of an acoustic wave device including a wiring electrode according to a fifth preferred embodiment of the present invention. FIG. 18 is a transverse sectional view of the wiring electrode according to the fifth preferred embodiment. An alternate long and short dash line A1 and an alternate long and short dash line A2 in FIG. 17 indicate boundaries between a first busbar of the IDT electrode and other portions. Alternate long and short dash lines A1 and A2 in a sectional view other than FIG. 17 also indicate similar boundaries.

As shown in FIGS. 17 and 18, a barrier layer 44 of a wiring electrode 41 of the present preferred embodiment includes a first barrier layer 44A and a second barrier layer 44B. The second barrier layer 44B is stacked on the first barrier layer 44A, and an outermost layer 5 is stacked on the second barrier layer 44B. For example, a material for the first barrier layer 44A and a material for the second barrier layer 44B may be same materials.

As shown in FIG. 18, in the present preferred embodiment, an outer peripheral edge of the first barrier layer 44A is located outside an outer peripheral edge of the second barrier layer 44B. An outer peripheral edge 44a of the barrier layer 44 is the outer peripheral edge of the first barrier layer 44A. In plan view, the outer peripheral edge of the second barrier layer 44B and an outer peripheral edge 5a of the outermost layer 5 overlap. Thus, as in the second preferred embodiment, the outer peripheral edge 5a of the outermost layer 5 is located inside the outer peripheral edge 44a of the barrier layer 44. An outer peripheral edge 3a of a low-resistance layer 3 is located inside an outer peripheral edge 2a of an adhesive layer 2, the outer peripheral edge 44a of the barrier layer 44, and the outer peripheral edge 5a of the outermost layer 5. In the present preferred embodiment, alloy formation by a metal from which the low-resistance layer 3 is made and a metal from which the outermost layer 5 is made can be reduced or prevented, and reliability can be improved, as in the second preferred embodiment. Note that the outer peripheral edge of the first barrier layer 44A and the outer peripheral edge of the second barrier layer 44B may overlap in plan view.

In an acoustic wave device 40 shown in FIG. 17, the wiring electrode 41 is provided integrally with an IDT electrode 53. More specifically, a first busbar 16 of the IDT electrode 53, and the adhesive layer 2, the low-resistance layer 3, and the first barrier layer 44A of the wiring electrode 41 are integrally provided. The first busbar 16 may include the second barrier layer 44B and the outermost layer 5, like the wiring electrode 41.

An example of materials for layers of the wiring electrode 41 and the IDT electrode 53 of the present preferred embodiment are as follows. The materials for the layers of the wiring electrode 41 and the IDT electrode 53, however, are not limited to the following ones.

Material for the adhesive layer 2: Ti
Material for the low-resistance layer 3: AlCu
Material for the first barrier layer 44A: Ti
Material for the second barrier layer 44B: Ti
Material for the outermost layer 5: Au At the time of obtainment of the acoustic wave device 40, a process of forming the wiring electrode 41 and a process of forming the IDT electrode 53 can be concurrently performed. This enables an improvement of productivity. A non-limiting example of a manufacturing method for the acoustic wave device 40 will be described below.

Figure 19:
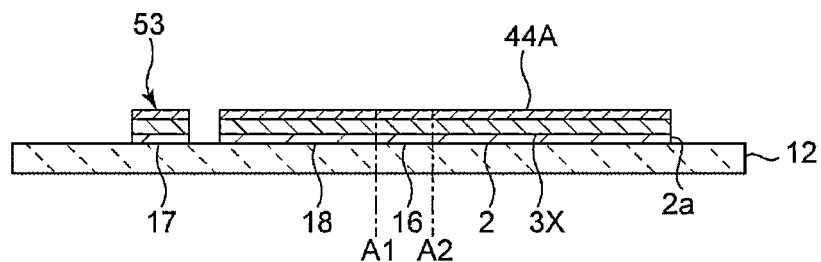
FIG. 19 is a sectional view showing a portion corresponding to the section shown in FIG. 17 for explaining a non-limiting example of a manufacturing method for the acoustic wave device according to the fifth preferred embodiment of the present invention.
Figure 20A:
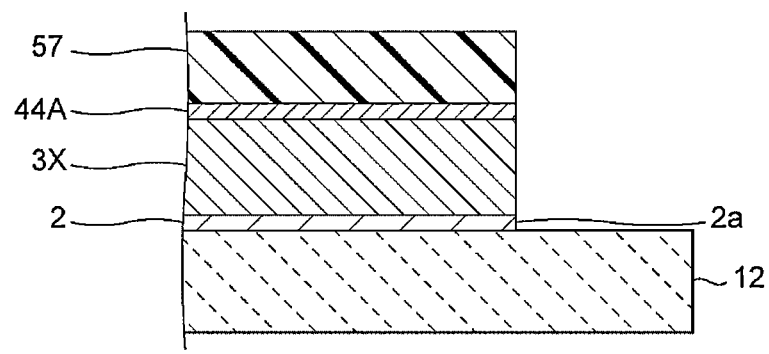
FIGS. 20A to 20C are enlarged sectional views for explaining the non-limiting example of the manufacturing method for the acoustic wave device according to the fifth preferred embodiment.
Figure 20B:
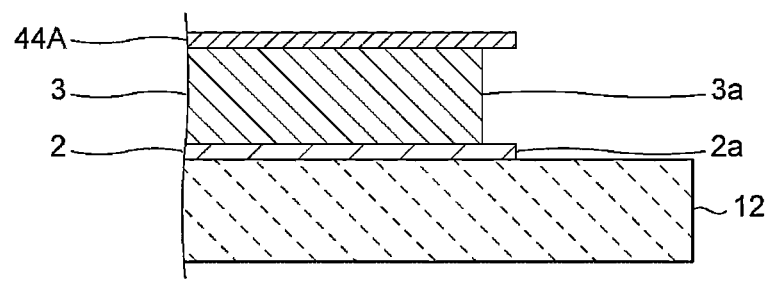
Figure 20C:
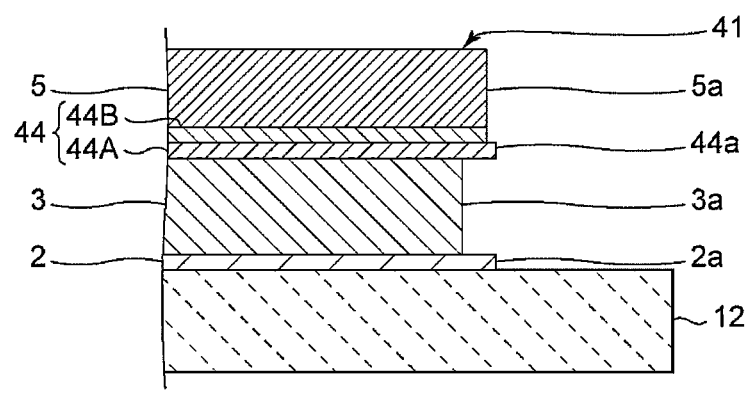

FIG. 19 is a sectional view showing a portion corresponding to the section shown in FIG. 17 for explaining the non-limiting example of the manufacturing method for the acoustic wave device according to the fifth preferred embodiment. FIGS. 20A to 20C are enlarged sectional views for explaining the non-limiting example of the manufacturing method for the acoustic wave device according to the fifth preferred embodiment.

As shown in FIG. 19, a multilayer body to define and function as a portion of the wiring electrode 41 and the IDT electrode 53 are formed on a piezoelectric substrate 12 using, for example, dry etching. More specifically, a metal layer to define and function as the adhesive layer 2, a metal layer 3X to define and function as the low-resistance layer 3, and a metal layer to define and function as the first barrier layer 44A are stacked on the piezoelectric substrate 12. The metal layers can be formed by, for example, evaporation or sputtering. A resist pattern is then formed on the metal layer to define and function as the first barrier layer 44A. Dry etching is then performed, and the resist pattern is peeled off after that. In this manner, the multilayer body to define and function as a portion of the wiring electrode 41 and the IDT electrode 53 are formed. Reflectors are formed concurrently with the IDT electrode 53.

As shown in FIG. 20A, a resist pattern 57 is then formed so as to expose side surfaces of the multilayer body to define and function as a portion of the wiring electrode 41. Side surfaces of the metal layer 3X to define and function as the low-resistance layer 3 are then dry-etched. At this time, a gas which acts on the metal layer 3X to define and function as the low-resistance layer 3 and acts poorly on the adhesive layer 2 and the first barrier layer 44A is used. More specifically, at the time of formation of the wiring electrode 41, for example, Cl-based gas is used as a dry etching gas. The type of the dry etching gas, however, is not limited to the above-described one.

The resist pattern 57 is then peeled off. With this peeling, the low-resistance layer 3, in which the outer peripheral edge 3a is located inside the outer peripheral edge of the first barrier layer 44A, is obtained, as shown in FIG. 20B. As shown in FIG. 20C, the second barrier layer 44B is then formed on the first barrier layer 44A, and the outermost layer 5 is formed on the second barrier layer 44B, by lift-off. With these operations, the wiring electrode 41 of the fifth preferred embodiment is obtained.

At the time of formation of the outermost layer 5, the outer peripheral edge 3a of the low-resistance layer 3 is located inside the outer peripheral edge of the first barrier layer 44A. A metal for forming the outermost layer 5 is unlikely to travel around to side surfaces 3b of the low-resistance layer 3. It is thus possible to effectively reduce or prevent alloy formation by a metal from which the low-resistance layer 3 is made and the metal, from which the outermost layer 5 is made. Additionally, even if the outermost layer 5 is heated and expands, the metal, from which the outermost layer 5 is made, needs to move on side surfaces of the second barrier layer 44B before the metal reaches the first barrier layer 44A. Thus, the metal of the outermost layer 5 is much more unlikely to reach the side surfaces 3b of the low-resistance layer 3, and alloy formation by the metal, from which the low-resistance layer 3 is made, and the metal, from which the outermost layer 5 is made, can be much more greatly reduced or prevented.

Meanwhile, if the outer peripheral edge of the second barrier layer 44B overlaps with the outer peripheral edge of the first barrier layer 44A in plan view, an area of the outermost layer 5 can be increased. With this configuration, an area of bonding between the wiring electrode 41 and the bump can be increased. It is thus possible to improve a force of bonding between the wiring electrode 41 and an external electrode or the like.

Note that the second barrier layer 44B need not be provided and that the barrier layer 44 may include only the first barrier layer 44A. Formation of the second barrier layer 44B and formation of the outermost layer 5 can be performed without intervention of a process, such as peeling of a resist pattern. Thus, a force of bonding between the second barrier layer 44B and the outermost layer 5 can be more reliably improved, and a force of bonding between the barrier layer 44 and the outermost layer 5 can be more reliably improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A wiring electrode which is provided on a substrate, the wiring electrode comprising:
    a plurality of layers including:
        an adhesive layer in contact with the substrate;
        an outermost layer indirectly above the adhesive layer;
        a low-resistance layer between the adhesive layer and the outermost layer, including a first principal surface on a side closer to the adhesive layer and a second principal surface facing the first principal surface, and having a lowest electric resistance among the plurality of layers; and
        a barrier layer between the low-resistance layer and the outermost layer; wherein
    the adhesive layer, the low-resistance layer, the barrier layer, and the outermost layer each include an outer peripheral edge; and
    an outer peripheral edge of the second principal surface of the low-resistance layer is located inside the outer peripheral edge of the barrier layer, and the outer peripheral edge of the adhesive layer is located outside the outer peripheral edge of the low-resistance layer, in plan view.

2. The wiring electrode according to claim 1, wherein the outer peripheral edge of the low-resistance layer is located inside the outer peripheral edge of the barrier layer.

3. The wiring electrode according to claim 1, wherein the outer peripheral edge of the outermost layer is located inside the outer peripheral edge of the barrier layer.

4. The wiring electrode according to claim 1, wherein the outer peripheral edge of the outermost layer is located inside the outer peripheral edge of the low-resistance layer.

5. The wiring electrode according to claim 1, wherein the outer peripheral edge of the outermost layer is located outside the outer peripheral edge of the low-resistance layer.

6. The wiring electrode according to claim 1, wherein the outer peripheral edge of the outermost layer and the outer peripheral edge of the barrier layer are located inside the outer peripheral edge of the adhesive layer.

7. The wiring electrode according to claim 1, wherein the low-resistance layer is made of Al or an alloy mainly including Al.

8. The wiring electrode according to claim 1, wherein the outermost layer is made of Au or an alloy mainly including Au.

9. The wiring electrode according to claim 1, wherein the adhesive layer is made of at least one of Ti, Ni, or Cr, or an alloy mainly including at least one of Ti, Ni, or Cr.

10. The wiring electrode according to claim 1, wherein a side surface of the low-resistance layer includes a curved surface.

11. The wiring electrode according to claim 2, wherein the outer peripheral edge of the outermost layer is located inside the outer peripheral edge of the barrier layer.

12. The wiring electrode according to claim 2, wherein the outer peripheral edge of the outermost layer is located inside the outer peripheral edge of the low-resistance layer.

13. The wiring electrode according to claim 3, wherein the outer peripheral edge of the outermost layer is located inside the outer peripheral edge of the low-resistance layer.

14. The wiring electrode according to claim 2, wherein the outer peripheral edge of the outermost layer is located outside the outer peripheral edge of the low-resistance layer.

15. The wiring electrode according to claim 3, wherein the outer peripheral edge of the outermost layer is located outside the outer peripheral edge of the low-resistance layer.

16. The wiring electrode according to claim 2, wherein the outer peripheral edge of the outermost layer and the outer peripheral edge of the barrier layer are located inside the outer peripheral edge of the adhesive layer.

17. The wiring electrode according to claim 3, wherein the outer peripheral edge of the outermost layer and the outer peripheral edge of the barrier layer are located inside the outer peripheral edge of the adhesive layer.

18. The wiring electrode according to claim 4, wherein the outer peripheral edge of the outermost layer and the outer peripheral edge of the barrier layer are located inside the outer peripheral edge of the adhesive layer.

19. The wiring electrode according to claim 1, wherein the outermost layer is a conductive layer including a conductive material that is different from a material included in the adhesive layer.

20. The wiring electrode according to claim 1, wherein a width at a center of the low-resistance layer is smaller than a width of the low-resistance layer at a portion where the low-resistance layer is in contact with another of the plurality of layers.

* * * * *